United States Patent [19]

Bjorksten et al.

[11] Patent Number: 5,966,522
[45] Date of Patent: Oct. 12, 1999

[54] MULTI-PHASE CLOCK DISTRIBUTION METHOD AND SYSTEM FOR COMPLEX INTEGRATED-CIRCUIT DEVICES

[75] Inventors: Andrew Augustus Bjorksten, Austin; Paul Gerard Villarrubia, Round Rock; Brian Allan Zoric, Austin, all of Tex.

[73] Assignee: International Business Machines Corporation, Armonk, N.Y.

[21] Appl. No.: 08/828,915

[22] Filed: Mar. 28, 1997

[51] Int. Cl.⁶ .................................................. G06F 17/50
[52] U.S. Cl. ................. 395/500.14; 395/500.07
[58] Field of Search ..................... 364/488, 489, 364/490, 491, 578; 395/555, 556, 558, 500.14, 500.07

[56] References Cited

U.S. PATENT DOCUMENTS

| | | | |
|---|---|---|---|
| 3,921,079 | 11/1975 | Heffner et al. ............................ | 328/62 |
| 4,638,256 | 1/1987 | Hong et al. ............................. | 328/105 |
| 5,012,427 | 4/1991 | Kuribayashi ............................ | 364/490 |
| 5,296,748 | 3/1994 | Wicklund et al. .................... | 307/303.1 |
| 5,339,253 | 8/1994 | Carrig et al. ............................ | 364/489 |
| 5,394,443 | 2/1995 | Byers et al. ............................ | 375/371 |
| 5,410,491 | 4/1995 | Minami .................................. | 364/491 |
| 5,422,915 | 6/1995 | Byers et al. ............................ | 375/357 |
| 5,519,351 | 5/1996 | Matsumoto .............................. | 327/295 |
| 5,557,779 | 9/1996 | Minami .................................. | 395/500 |
| 5,598,346 | 1/1997 | Agrawal et al. ........................ | 364/489 |
| 5,724,557 | 3/1998 | McBean, Sr. ........................... | 395/500 |
| 5,734,582 | 3/1998 | Bertolet et al. ......................... | 364/490 |
| 5,784,600 | 7/1998 | Doreswany et al. .................... | 395/558 |
| 5,787,268 | 7/1998 | Sugiyama et al. ...................... | 395/500 |
| 5,790,841 | 8/1998 | Scherer et al. .......................... | 395/558 |

*Primary Examiner*—Kevin J. Teska
*Assistant Examiner*—Leigh Marie Garbowski
*Attorney, Agent, or Firm*—Anthony V.S. England; Andrew J. Dillon

[57] ABSTRACT

A system and method are provided for distributing clock signals within integrated circuitry. The system includes a number of cells for the integrated circuitry such that the cells include substantially horizontal regions within which are disposed substantially horizontal lines representative of a first clock. The cells also include substantially vertical regions within which are disposed vertical lines representative of a second clock. The cells are disposed in substantially horizontal layers. The vertical regions, including the vertical lines representative of a second clock are substantially vertically aligned. The cells include circuitry disposed within each cell such that a first portion of such circuitry includes signal wiring, and a second portion of such circuitry includes clock wiring, and such that the disposition of said circuitry minimizes a cumulative length of signal wiring and clock wiring.

6 Claims, 9 Drawing Sheets

MULTI-PHASE CLOCK DISTRIBUTION METHOD AND SYSTEM FOR COMPLEX INTEGRATED-CIRCUIT DEVICES

BACKGROUND OF THE INVENTION

1. Technical Field

The present invention relates in general to integrated-circuit technology and more particularly to the design of very large-scale integrated circuits. In particular, the present invention relates to the layout of logic cells in a space-efficient and wireable fashion and which can readily be integrated into design automation systems.

2. Description of the Related Art

Distributed multiple clock systems are often necessary for implementing high-performance circuit designs. Modern digital circuitry and computer systems often require the use of such clock-distribution systems. A distributed multiple clock system typically includes multiple clock lines which are distributed physically within a circuit in various locations, lengths, and directions. Such systems are usually controlled by continuous, periodic clock pulses, which allow activity within the system to occur at a fixed time relative to one or more clock pulses.

A problem inherent to these systems is clock skew. Clock skew can occur, for example, in latching circuits where two or more clock signals have travelled through different delay paths to arrive at the same latch. A delay in the amount of time for each signal to arrive at the same latch can result from the physical differences in delay paths (e.g., one path might have a longer length than another), or the differences in the timing of the clocks which provide clock signals to the particular circuit. Such delays, whether due to physical differences in clock paths or clock-timing variations can cause latch transmission gates within the circuit to couple. Clock skew can be described as the time between the latest-arriving clock at any latch point minus the earliest-arriving time of all of the clocks at all of the latch points. Clock-skew conditions can lead to incorrect storage-capacitance values and, ultimately, to poor circuit designs. Another reason to reduce clock skew is that, the smaller the skew, the more time is available for logic calculations.

Clock skew can be reduced by making this time difference as small as possible by, in effect, forcing the delay between the clocks to be constant. However, such a reduction in clock skew is difficult to achieve, particularly if a simultaneous design goal is to achieve an efficient wiring scheme. Reducing clock skew directly contributes to the design of high-performing circuits. Unfortunately, maintaining low clock skew without adversely affecting wireability and overly complicating design automation is difficult. Thus, designing a high-performance circuit having a reliable clock scheme in a space-efficient and wireable fashion and in which clock skew is reduced poses a difficult task to the circuit designer.

Thus, a need exists for a multi-phase clock distribution method and system in which clock skew is effectively reduced, contributing to higher-performance designs. A multi-phase clock distribution method and system would allow for the design of a circuit in which phase differences in clock signals and physical differences in clock paths do not result in clock skew or, at the very least, in negligible clock skew. In addition, a need exists for a clocking scheme in which low clock skew is achieved while resulting in a relatively small impact to wiring overhead. Finally, a need exists for a clocking strategy that can be easily incorporated into design automation systems.

SUMMARY OF THE INVENTION

It is therefore an object of the present invention to provide for an improved integrated-circuit technology.

It is another object of the present invention to provide an improved integrated-circuit technology for the design of very large-scale integrated circuits.

It is still another object of the present invention to provide for an improved layout of logic cells utilized in integrated circuits in a space-efficient and wireable fashion, and which can readily be integrated into design automation systems.

The above and other objects are achieved as is now described. A system and method for distributing clock signals within integrated circuitry are presented. The system includes a number of cells for the integrated circuitry such that the cells include substantially horizontal regions within which are disposed substantially horizontal lines representative of a first clock. The cells also include substantially vertical regions within which are disposed vertical lines representative of a second clock. The cells are disposed in substantially horizontal layers. The vertical regions, including the vertical lines representative of a second clock are substantially vertically aligned. The cells include circuitry disposed within each cell, such that a first portion of such circuitry includes signal wiring, and a second portion of such circuitry includes clock wiring, such that the disposition of said circuitry minimizes a cumulative length of signal wiring and clock wiring.

BRIEF DESCRIPTION OF THE DRAWINGS

The novel features believed characteristic of the invention are set forth in the appended claims. The invention itself, however, as well as a preferred mode of use, further objects, and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
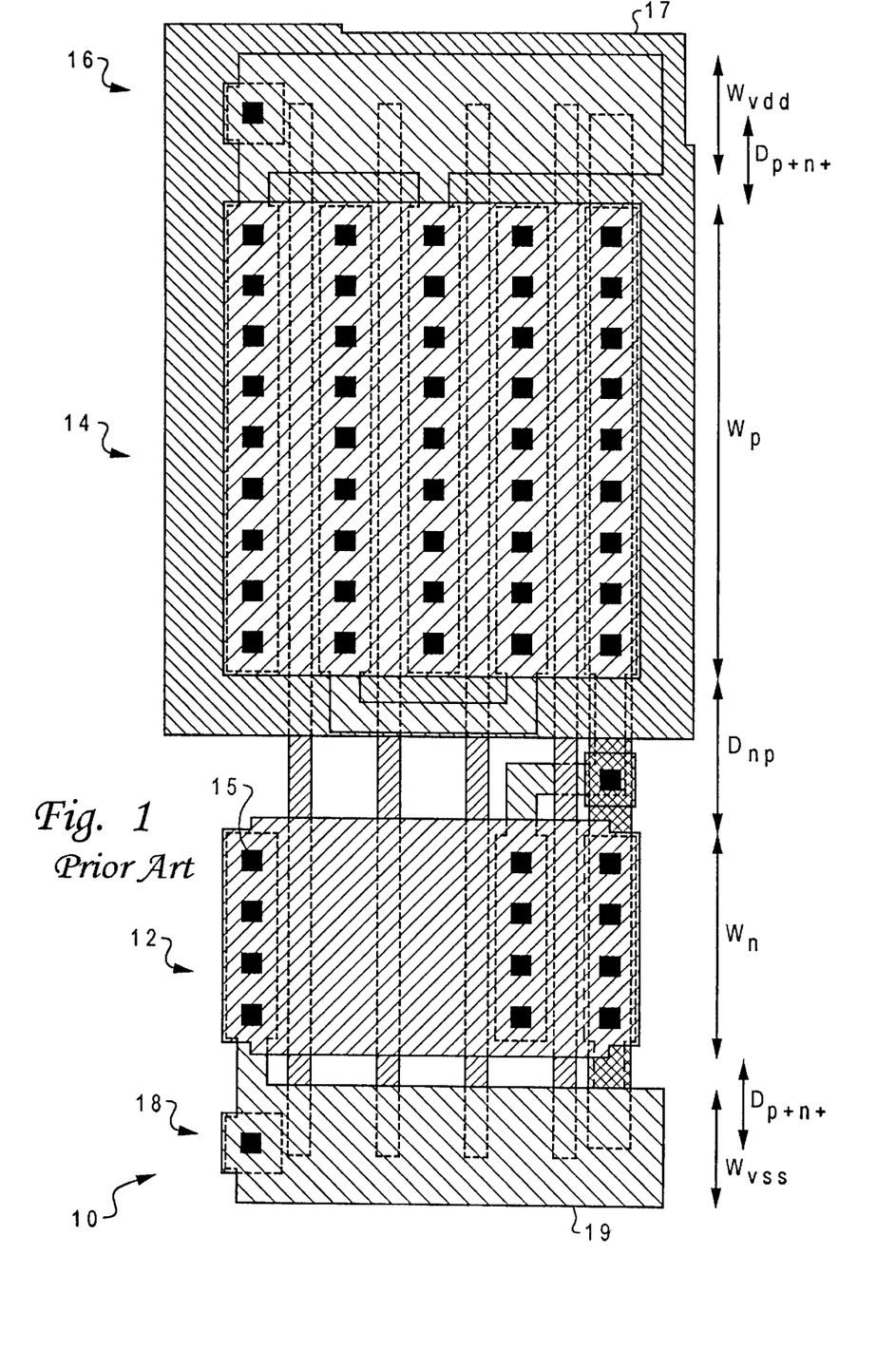
FIG. 1 is a layout diagram of a prior-art CMOS cell design.
Figure 2A:
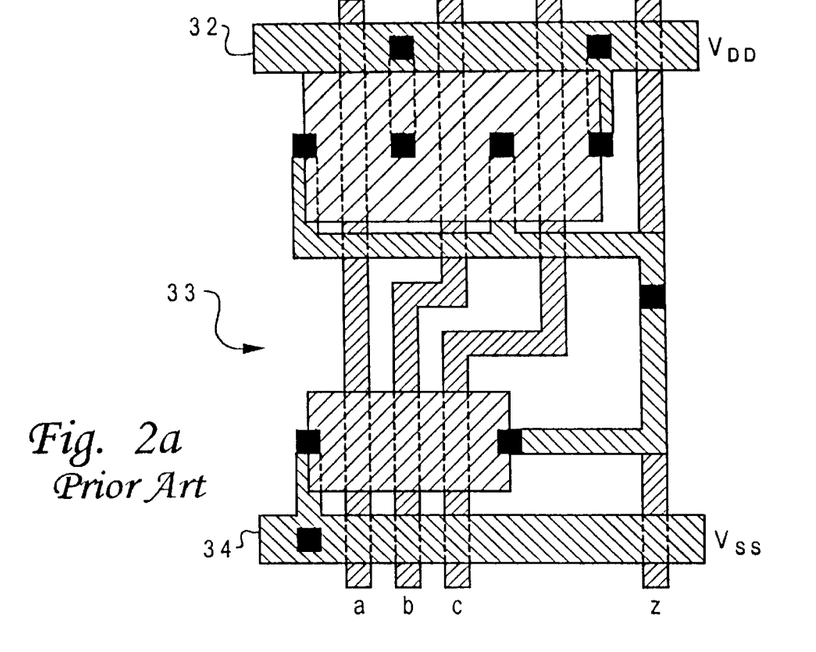
FIG. 2 depicts four prior-art plan-view-layout diagrams of representative circuit cells.
Figure 2B:
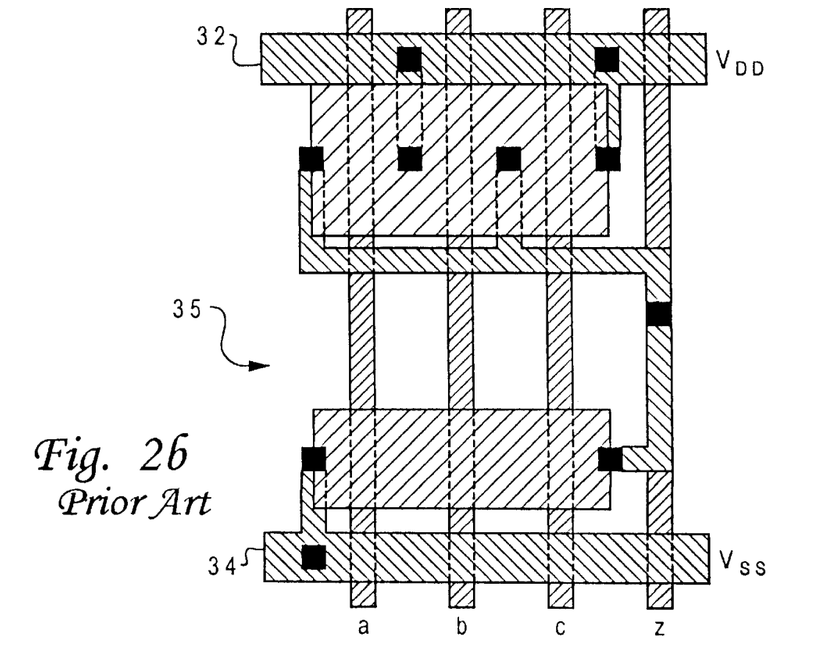
Figure 2C:
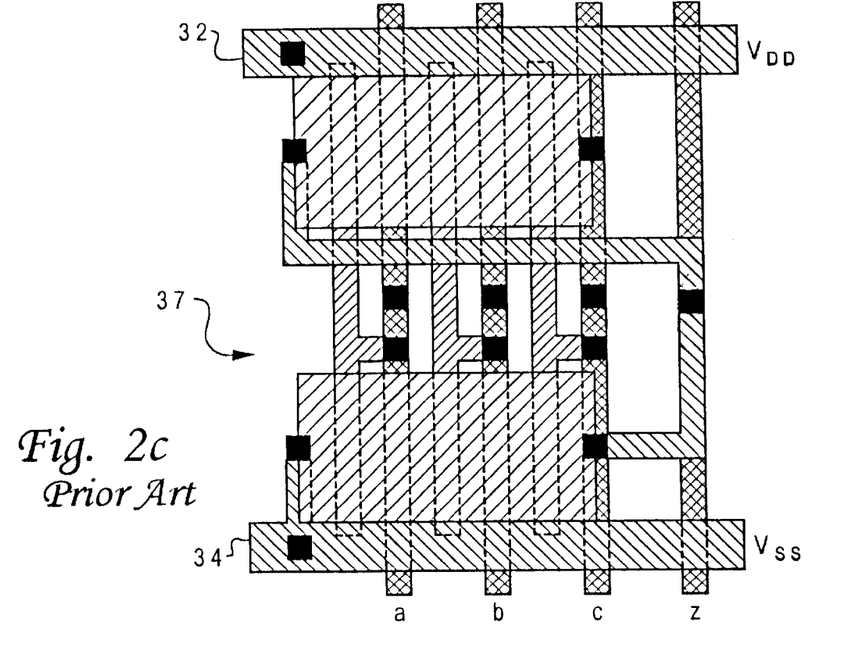
Figure 2D:
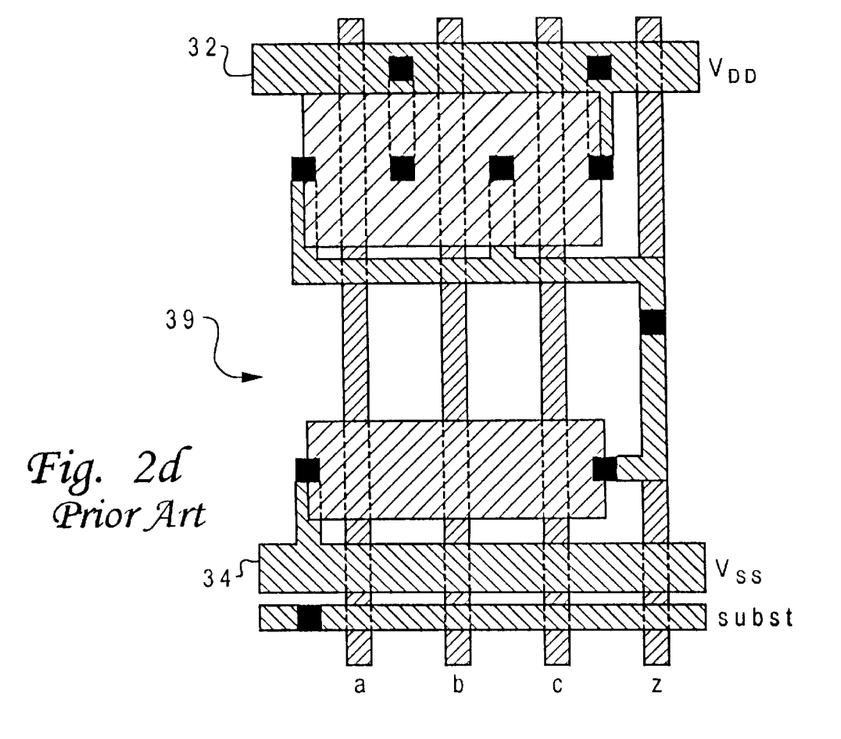

With reference now to the figures and, in particular, with reference to FIG. 1, a layout diagram of a prior-art Complementary-Metal-Oxide-Silicon (CMOS) cell design is depicted. In FIG. 1, CMOS cell 10 can be combined with other cells to form a complex integrated-circuit device image, also referred to as a macro and described in greater detail herein. CMOS cell 10 is a semiconductor device that consists of two metal-oxide semiconductor field-effect transistors (MOSFETs), one N-type and one P-type, integrated on a single silicon chip. CMOS devices, such as CMOS cell 10, can be utilized for random-access memory (RAM) and switching applications, and have very high speeds and low power consumption.

The construction process for a CMOS device such as CMOS cell 10 is carried out on a single crystal of silicon, which is available in the form of thin, flat, circular wafers around 15 cm in diameter. Heavily doped n-type source and drain regions are fabricated in a p-type substrate (i.e., often called the body). A thin layer of silicon dioxide can be grown over the substrate material and a conductive gate material (i.e., metal or polycrystalline silicon) covers this oxide between source and drain. The gate-source voltage is used to modify the conductance of the region under the gate. This allows the gate voltage to control the current flowing between source and drain, giving switching characteristics in digital circuits.

When designing standard cells or polycells such as CMOS cell 10, geometric regularity is often required to maintain common electrical characteristics between cells in a macro. A common physical limitation of CMOS cells, such as CMOS cell 10, is to fix the physical height of the cell and vary the width according to the function. CMOS cell 10 is composed of a row 12 of n-transistors of maximum height $W_n$ and a row 14 of p-transistors of maximum height $W_p$, separated by a distance $D_{np}$, a design separation between n- and p- active areas. Power 16 ($V_{DD}$) and ground 18 ($V_{SS}$) buses traverse the cell at the top 17 and bottom 19. The internal area of the cell can be utilized for routing transistors.

In the design of CMOS cell 10, layout symbols are substituted for schematic symbols. In a schematic diagram, lines drawn between device terminals represent connections. Any non-planar situation is dealt with by simply crossing two lines (e.g., the connection between the drain of an n-transistor and the drain of a p-transistor). However, in a physical layout such as that depicted in FIG. 1, the designer must concern himself with the interaction of physically different interconnection layers. For example, as is known from the fabrication process, the source and drain of an n-transistor constitute n-diffusion regions, while the p-transistor utilizes p-diffusion regions for such connections. Additionally, in a bulk CMOS process, it is not possible or, at the very least, very difficult, to make a direct connection from n-diffusion to p-diffusion.

Thus, simple inter-drain connections can be implemented in the structural domain as, at least, one wire and two contacts in the physical domain. This is true for most technologies in the art of circuit design, but not all technologies. Assuming that such a process does not have local interconnect or buried contacts, such a connection constitutes metal. By similar reasoning, the simple connections to power, $V_{DD}$, and ground, $V_{SS}$, can be made using metal wires and contacts. Power and ground are usually run in metal (i.e., for low resistance from circuit to power supply). The common-gate connection can be a simple polysilicon wire. Finally, substrate contacts 15 that are not implied in a schematic diagram are added to a symbolic layout such as that depicted in FIG. 1.

Complex digital systems are broken down into component gates and memory elements by successively subdividing the system in a hierarchical manner. Such a subdivision in a complex digital system can be performed manually or can be highly mechanized. Standard VLSI circuit-design techniques begin with the layout of a cell structure. The cell structure is an image of a circuit with representations of circuit elements such as transistors, connecting lines, ground lines, and clock lines. A typical circuit cell image has the following general characteristics: 1. Logic circuits are laid out in parallel rows so that diffusions run horizontally and metal interconnections can be either horizontal or vertical over the circuits; 2. Clock phase lines run horizontally along the center of the cell image; and 3. Regions within the cell are reserved for specific circuit elements and additional vertical and horizontal columns represent connections to the clock phase lines and the ground and voltage supply lines.

The clock phase lines are connected to a system clock, which is the electronic circuit in a computer that generates a steady stream of timing pulses—the digital signals that synchronize operations in a computer. The clock rate of a computer is one of the prime determinants of the overall processing speed of the computer, and the clock rate can go as high as the other components of the computer allow.

FIG. 2 depicts four plan-view, prior-art layout diagrams of representative circuit cells. In designing a layout diagram for a circuit cell, a plan view is normally accorded for the circuit cell, because a plan view allows a designer to scrutinize a cell layout in the same manner that an individual might view an aerial map. Each layout diagram indicates the presence of power $V_{DD}$ 32, and ground $V_{SS}$ 34, which run as buslines horizontally across the top and bottom edges of each cell. Cell 33 depicts a layout style in which series n-transistors are compressed to reduce capacitance. Cell 35 depicts a standard gate. Cell 37 shows polysilicon strapped with an M2 metal layer. Cell 39 shows a standard cell configuration in which the substrate is separated from ground $V_{SS}$ 34. Such cells can be connected to one another to form rows of circuit cells connected to one another by bus lines, in particular the $V_{DD}$ 32 and ground $V_{SS}$ 34 bus lines. The prior-art cells as depicted in FIG. 2, however, cannot be utilized in association with the method and system of the present invention without further modifications. To be utilized in accordance with the method and system of the present invention, the cells depicted in FIG. 2 should be modified to reserve tracks for clock lines. Examples of such modified cells are described in the text associated with FIG. 7 herein.

Figure 3:
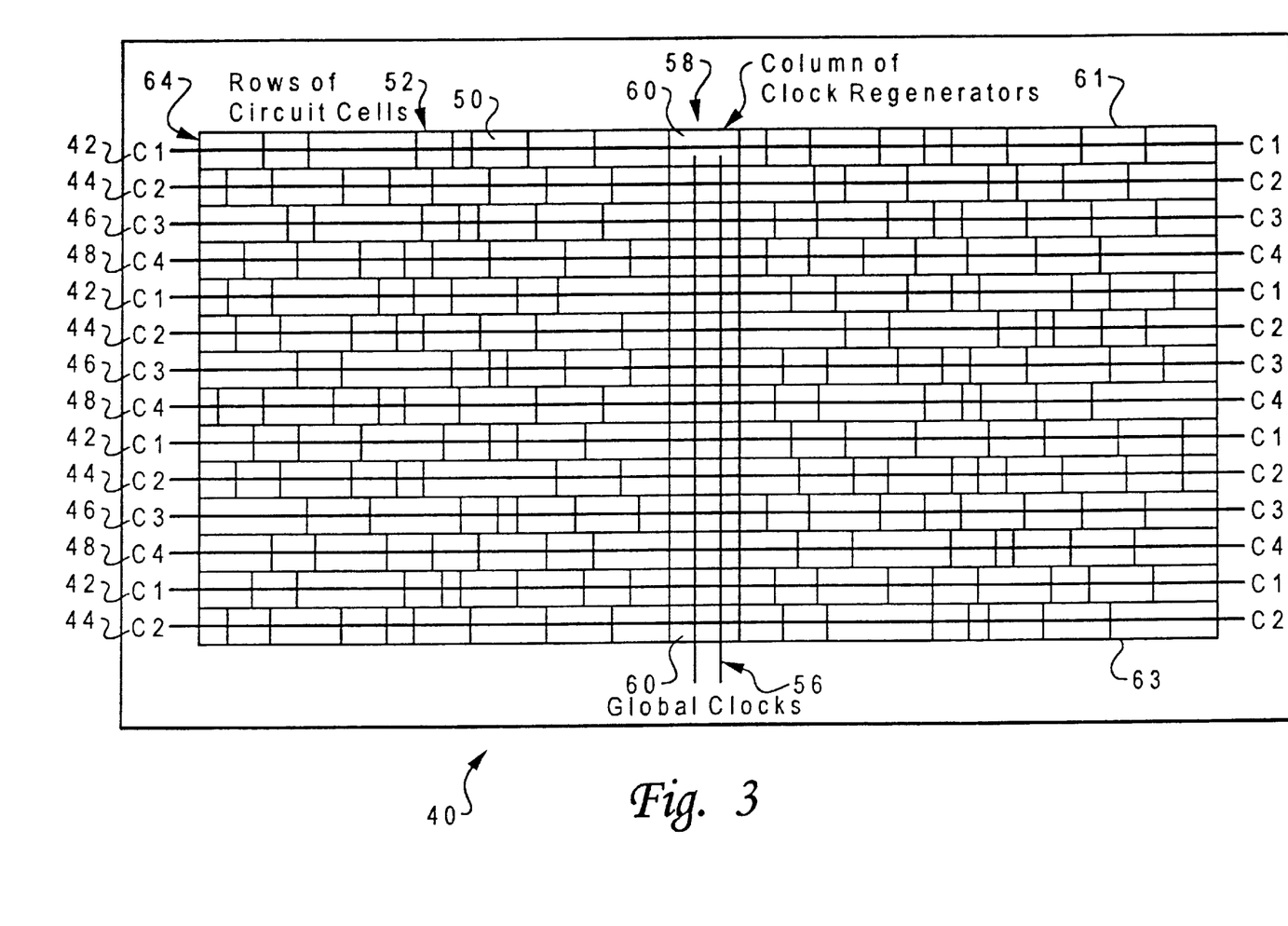
FIG. 3 is a plan view of a first example of a layout diagram of a library of cell images having a multi-phase clock distribution scheme in accordance with the system and method of the present invention.

FIG. 3 is a plan view of a first example of a layout diagram of a library of cell images having a multi-phase clock distribution scheme in accordance with the system and method of the present invention. The library of cells or cell images is referred to as a macro 40, a term utilized in the art of integrated-circuit design to describe a layout design for a complex integrated circuit. Cells are designed with a specific function in mind (e.g., an AND or OR function) and are reproduced multiple times to create a macro, such as a microprocessor design utilized in manufacturing microprocessor chips. Thus, a library (i.e., a collection) of multiple dynamic logic cells can be utilized to build a macro such as macro 40 shown in FIG. 3. Macro 40 can be designed utilizing an automation package such as a computer-aided design graphics application package or, alternatively, utilizing conventional drafting techniques.

In FIG. 3, rows 52 of circuit cells 50 run horizontally across the width of macro 40. A total of fourteen rows 52 are depicted in FIG. 3. Each row 52 is composed of individual cells 50 through which clock lines run horizontally. Such horizontal clock lines constitute clock prewires, and are identified as C1 42, C2 44, C3 46, and C4 48. A line is said to be prewired when it is reserved for a particular function prior to subsequent modifications to an integrated-circuit design in which the prewire is located. For example, while device images within a macro can be altered or changed, the prewire remains the same throughout the design process. A central column 58 is reserved for clock regenerator cells. Each cell 50 can represent the image of a standard CMOS device such as those devices depicted, for example, in FIG. 7 herein.

A representative row 64 is depicted in FIG. 3. Row 64 is positioned at the top 61 of macro 40. Row 64 includes a total of eighteen cells 50, and is an example of an individual row 52. Central column 58 is a vertical region of macro 40 within which is disposed the image of a first type of integrated-circuit clock. In this case, the first type of integrated-circuit clock is a clock regenerator. The horizontal clock lines, C1 42, C2 44, C3 46, and C4 48, within macro 40 represent the image of a second type of integrated circuit. The horizontal row of cells running the length of macro 40 constitute a horizontal region within which is disposed the second type of integrated-circuit clock. Macro 40 is designed such that the horizontal region intersects the vertical region in such a manner so as to reduce clock skew within a complex integrated-circuit device image (i.e., macro 40), while contributing to the formation of the complex integrated-circuit device image in a space-efficient and wireable fashion.

Macro 40 can form the basis of a complex integrated-circuit design. Silicon, a semiconductor, forms the basic starting material for the large class of integrated circuits known as Metal-Oxide-Silicon (MOS) circuits. A CMOS circuit is a particular-type MOS device. A MOS structure is created by superimposing several layers of conducting, insulating, and transistor-forming materials to create a sandwich-like structure. These structures are created by a series of chemical-processing steps involving oxidations of the silicon, diffusion of impurities into the silicon to give it certain conduction characteristics, and deposition and etching of aluminum on the silicon to provide interconnection in the same way that a printed wiring board is constructed. After a series of processing steps, a typical structure can include levels of diffusion, polysilicon, and metal that are separated by insulating layers. A first layer of metal is referred to as M1, a second layer of metal as M2, and so forth. Polysilicon is silicon which has been formed in a polycrystalline form (i.e., not having a single-crystalline structure). Polysilicon is often used as an interconnect in silicon integrated circuits and as a gate electrode on MOS transistors.

Thus, as depicted in FIG. 3, by reserving vertical columns of space in a vertical region of macro 40 for clock regenerator cells 60, such as column 58, and reserving horizontal tracks of M1 metal per circuit row for clock prewires, an improved multi-phase clock distribution can be achieved with a low impact to overall clock skew and macro wireability. Also the improved multi-phase clock distribution, due to its regular and systematic nature (i.e., based on a given arrangement) can be easily incorporated into existing automation (e.g., existing software design packages). Clock regenerator cells 60 are vertically stacked from the top 61 to the bottom 63 of macro 40 and also periodically across the macro. Such stacks of clock regenerator cells 60 are driven from global clock wires 56 with vertical wiring. Thus, an image of a global clock runs vertically through the vertical region to drive the column of clock regenerator cells.

A column 58 of clock regenerator cells 60 is present in each macro. Also, at least one clock regenerator cell is present within each row 52. Thus, for example, representative row 64 includes eighteen individual cells 50, at least one of which is a clock regenerator cell 60 which also forms a portion of column 58. Thus, column 58 and row 64 intersect at cell 60. This is also true for each row 52 of the macro.

The clock regenerator cells 60 drive a pre-placed horizontal M1 strip of metal which reaches all circuit cells potentially requiring that phase of the clock. The pre-placed horizontal M1 strip of metal is equivalent to a clock line. Thus, M1 metal strips form clock lines C1 42, C2 44, C3 46, and C4 48, and are fabricated by the process described earlier. Multiple clocks are handled by assigning the clocks over a number of rows, or multiple prewires per row. For example, two clock lines may be designated for a given row instead of one clock line. The choice depends on given design goals.

Circuit cells 50, including clock regenerator cells 60, are placed within macro 40 in such a manner as to minimize signal wiring and clock wiring. After cell placement within macro 40, clock wiring is performed. There is no need at this point to add additional clock lines because all clock lines necessary are already in place within macro 40. Clock lines C1 42, C2 44, C3 46, and C4 48 can be initially laid out in the macro, followed by the designation of areas of the macro as cells 50. Cells 50 placed in a row requiring the same clock as is assigned to that row need only be connected with a short M1 metal strip. For example, if a particular cell 50 includes a NAND gate requiring a clock input, then a short M1 metal strip can be connected to a clock line already running through the center of that particular cell. Also, cells placed in a row requiring a clock in the adjacent row need only be connected with a one-circuit-row-high M2 metal run.

In FIG. 3, the maximum clock run available would be a run for a cell in the top row needing a C4 clock, or a cell in the bottom row needing a C3 clock. Thus, three rows must be spanned. The average run is about one circuit row $((¼*0)+(½*1)+(¼*2)=1)$. Heuristics can be added to reduce the maximum and average clock runs. More clock regenerators can be added to reduce overall clock skew. Longer M2 runs are required for cells requiring a clock from more distant rows. A controlled maximum run and statistically average run can be evaluated after clocks are assigned to rows and prior to actual cell placement.

Figure 4:
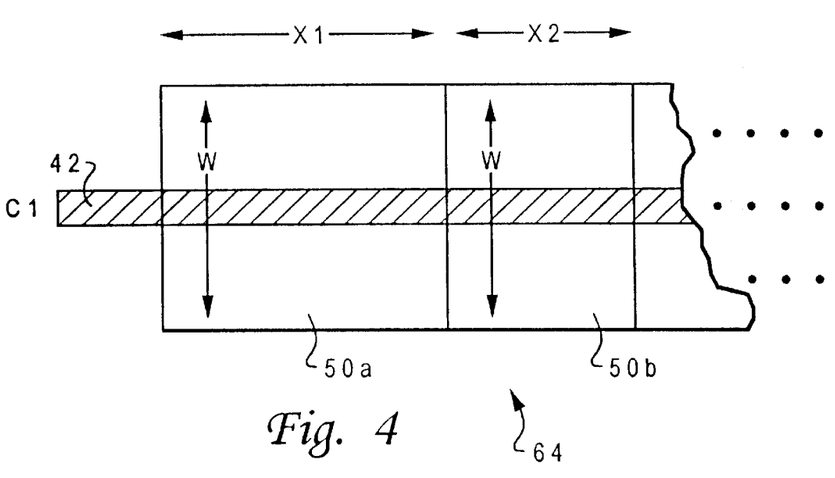
FIG. 4 illustrates a plan view of a portion of an individual row of cells maintained within a library of cell images having a multi-phase clock distribution scheme in accordance with the system and method of the present invention.

FIG. 4 illustrates a plan view of a portion of an individual row maintained within macro 40 in accordance with the system and method of the present invention. In FIG. 3 and FIG. 4, like parts are indicated by like numbers. Thus, in FIG. 4, a portion of representative row 64 is depicted. Two cells 50a and 50b are located within row 64 adjacent one another. Each cell has an identical width W. However, cell 50a has a length X1, and cell 50b has a length X2. Clock C1 42 runs through the center of row 64. Cell-layout diagrams such as those depicted in FIG. 7 herein, can be placed within each cell 50a and 50b and connected to $V_{DD}$ (i.e., power supply) lines (not shown in FIG. 3 and FIG. 4) and clock C1 42. For example, a layout diagram of a NAND gate can be placed within cell 50a, while a layout diagram of a NOR gate can be placed within cell 50b.

Figure 5:
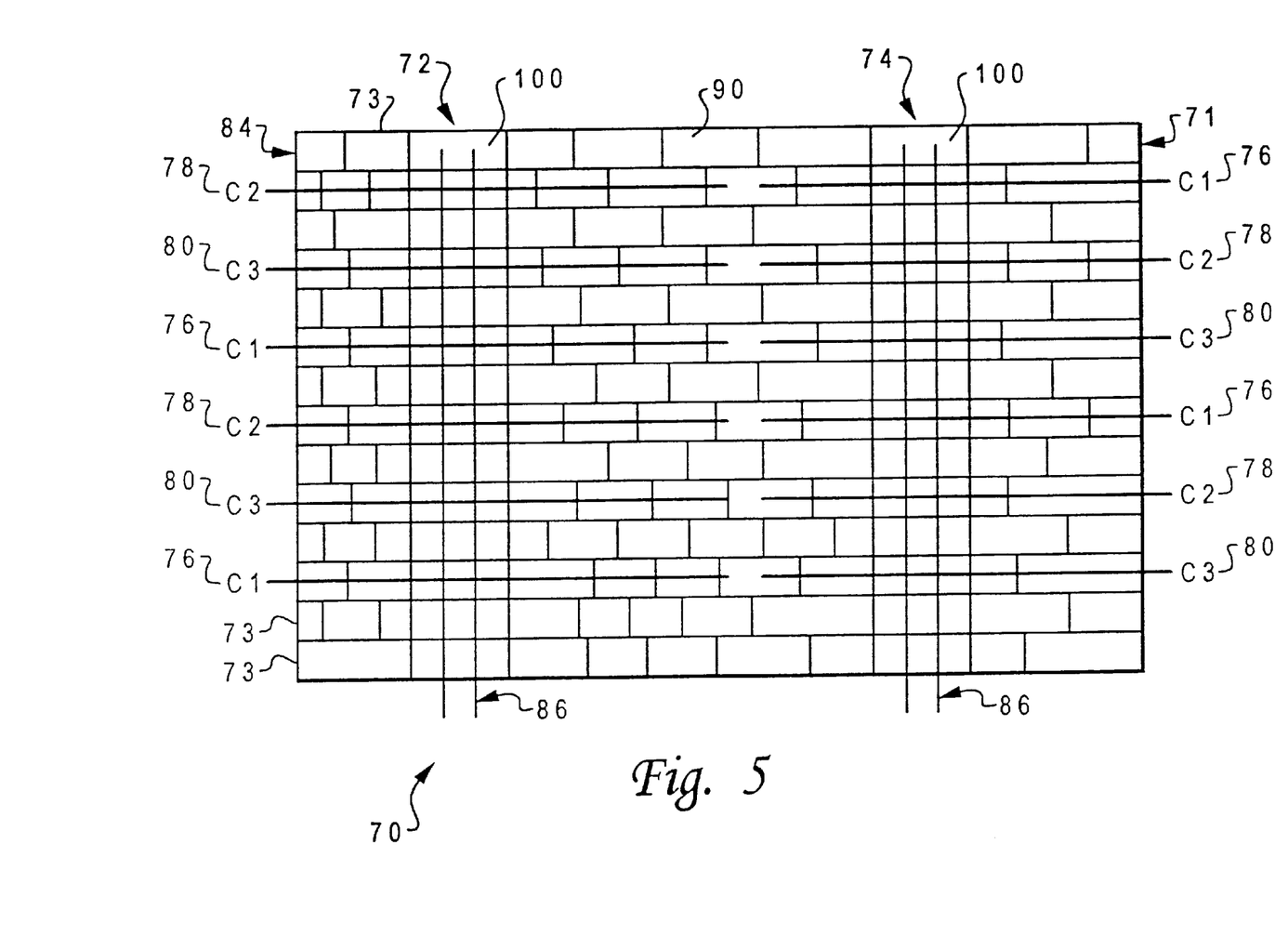
FIG. 5 is a plan view of a layout diagram of a second example of a library of cell images having a multi-phase clock distribution scheme in accordance with the system and method of the present invention.

FIG. 5 is a plan view of a layout diagram of a second example of a library of cell images having a multi-phase clock distribution scheme in accordance with the system and method of the present invention. The library of cells or cell images forms a macro 70. Cells are designed with a specific function in mind (e.g., an AND or OR function) and are reproduced multiple times to create a macro, such as a microprocessor design utilized in manufacturing microprocessor chips. Thus, a library (i.e., a collection) of multiple dynamic logic cells can be utilized to build a macro such as macro 70 shown in FIG. 5. Macro 70 can be designed utilizing an automation package such as a computer-aided design graphics application package or, alternatively, utilizing conventional drafting techniques.

In FIG. 5, rows 73 of circuit cells 90 run horizontally across the width of macro 70. A total of fourteen rows 73 are depicted in FIG. 5. Each row 73 is composed of individual cells 90 through which clock lines run horizontally. Such horizontal clock lines constitute clock prewires, and are identified as C1 76, C2 78, and C3 80. Two columns 72 and 74 are reserved for clock regenerator cells 100. Each cell 90 can represent the image of a standard CMOS device, such as those devices depicted, for example, in FIG. 7 herein.

A representative row 84 is depicted in FIG. 5. Row 84 is positioned at the top 71 of macro 70. Row 84 includes a total of ten cells 90, and is an example of an individual row 73. Column 72 is a vertical region of macro 70 within which is disposed the image of a first type of integrated-circuit clock. In this case, the first type of integrated-circuit clock is a clock regenerator. Column 74 is a vertical region of macro 70 within which is also disposed the image of a first type of integrated-circuit clock (i.e., a clock regenerator). The horizontal clock lines, C1 76, C2 78, and C3 80, within macro 70 represent the image of a second type of integrated circuit. The horizontal row of cells running the length of macro 70 constitute a horizontal region within which is disposed the second type of integrated-circuit clock. Macro 70 is designed such that the horizontal region intersects the vertical regions in such a manner so as to reduce clock skew within a complex integrated-circuit device image (i.e., macro 70), while contributing to the formation of the complex integrated-circuit device image in a space-efficient and wireable fashion. Clock skew is reduced because the clocks are placed within macro 70 in an orderly fashion, not random or based simply on convenience as is the case with traditional macros.

Figure 6:
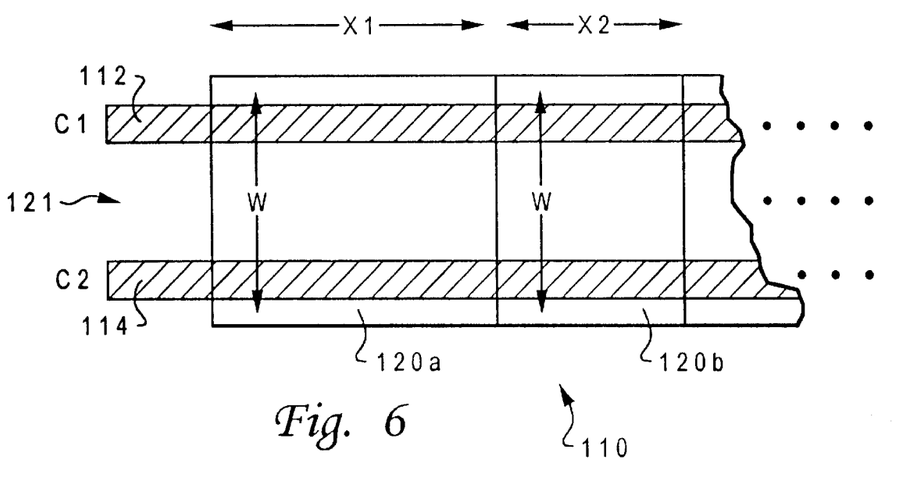
FIG. 6 illustrates a plan view of a portion of an individual row of cells maintained within a library of cell images wherein are disposed two clock lines in accordance with the system and method of the present invention.

FIG. 6 illustrates a plan view of a portion 110 of an individual row of cells maintained within a library of cell images wherein are disposed two clock lines 112 and 114 in accordance with the system and method of the present invention. Two cells 120a and 120b are located within row 121 adjacent one another. Each cell has an identical width W. However, cell 120a has a length X1, and cell 120b has a length X2. Clocks C1 112 and C2 114 run through row 121. Cell-layout diagrams such as those depicted in FIG. 7 herein can be placed within each cell 120a and 120b and connected to $V_{DD}$ (i.e., power supply) lines (not shown) and clocks C1 112 and C2 114.

Figure 7A:
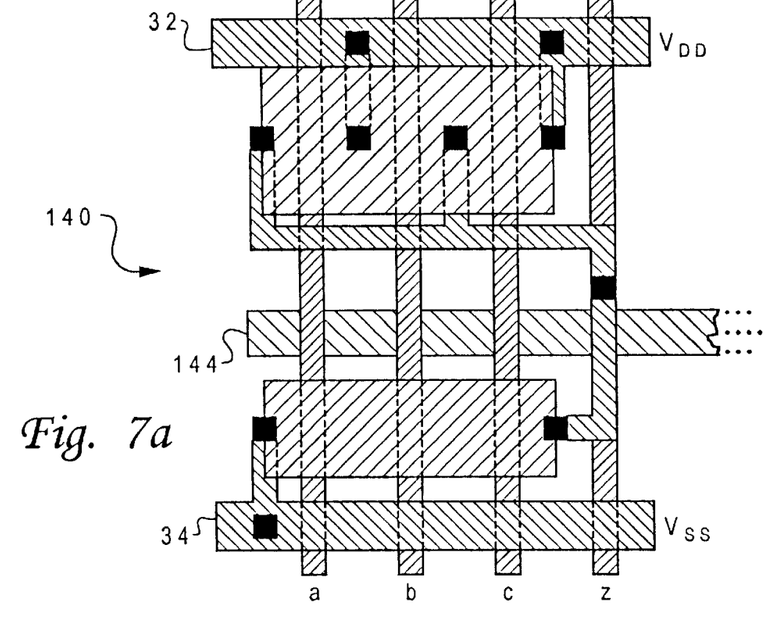
FIG. 7 depicts two plan-view-layout diagrams of representative circuit cells which can be utilized in accordance with the system and method of the present invention.
Figure 7B:
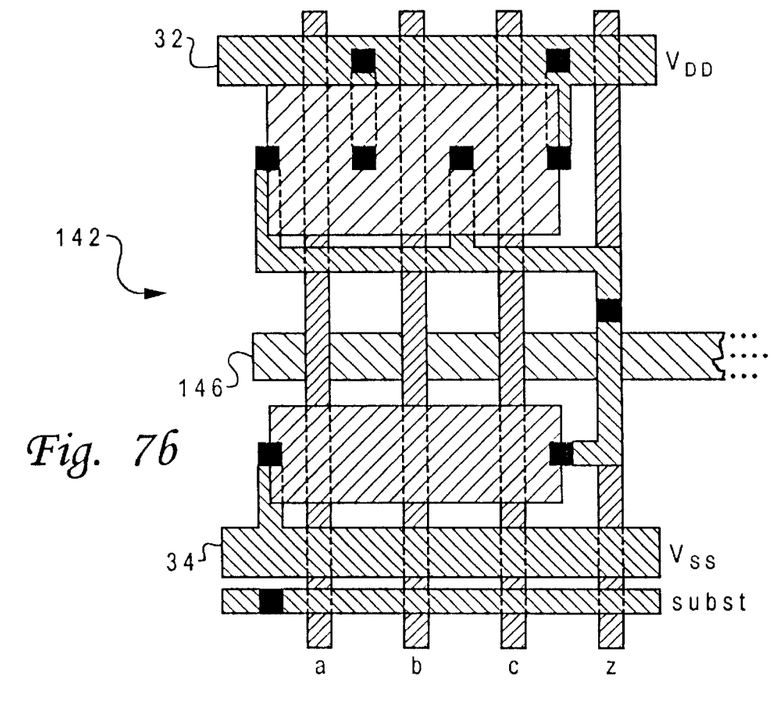

FIG. 7 depicts two plan-view-layout diagrams of representative circuit cells which can be utilized in accordance with the system and method of the present invention. In FIG. 2 and FIG. 7, like parts are indicated by like number. FIG. 7(a) is a cell-layout circuit which is placed over a clock line 144. FIG. 7(b) is a cell-layout circuit which is placed over a clock line 142. The plan-view-layout diagrams of representative circuit cells depicted in FIG. 7 differ from the prior-art circuit-cell-layout diagrams depicted in FIG. 2 in that the examples FIG. 7 can be utilized with specially cleared tracks (i.e. for clock lines) designated within a macro. The devices shown in FIG. 2 do not include such cleared tracks. Thus, the devices depicted in FIG. 7 are modified versions of the devices depicted in FIG. 2.

Figure 8:
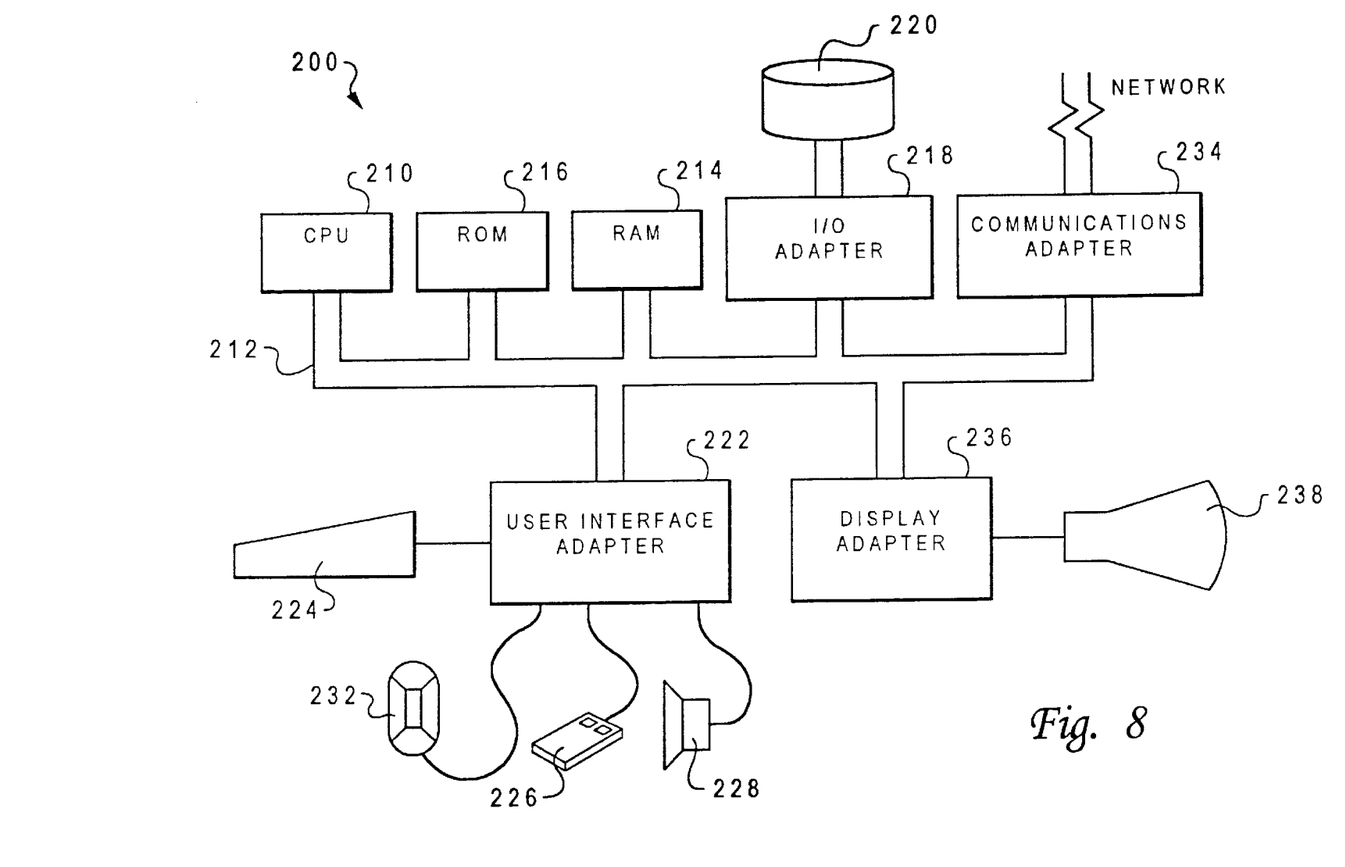
FIG. 8 illustrates an example of a data-processing system which can be utilized in accordance with the system and method of the present invention.

FIG. 8 depicts an example of a data-processing system 200 which can be utilized for the present invention. The system has a central processing unit (CPU) 210, such as a PowerPC™ microprocessor ("PowerPC" is a trademark of IBM Corporation) according to "The PowerPC Architecture: A Specification for a New Family of RISC Processors," 2d edition, 1994, Cathy May et al. Ed., which is incorporated herein by reference. A more specific implementation of a PowerPC™ microprocessor is described in the "PowerPC 604 RISC Microprocessor User's Manual," 1994, IBM Corporation, which is incorporated herein by reference. CPU 210 is coupled to various other components by system bus 212. Read-only-memory (ROM) 216 is coupled to the system bus 212 and includes a basic input/output system ("BIOS") that controls certain basic functions of the data-processing system 200.

Random-access-memory ("RAM") 214, I/O adapter 218, and communications adapter 234 are also coupled to system bus 212. I/O adapter 218 may be a small computer system interface (SCSI) adapter that communicates with a disk storage device 220. Communications adapter 234 interconnects bus 212 with an outside network enabling the data-processing system to communicate with other such systems. Input/output devices are also connected to system bus 212 via user-interface adapter 222 and display adapter 236. Keyboard 224, trackball 232, mouse 226 and speaker 228 are all interconnected to bus 212 via user-interface adapter 222. Display monitor 238 is connected to system bus 212 by display adapter 236. In this manner, a user can input data to the system via keyboard 224, trackball 232, or mouse 226, and, likewise, can receive output from the system via speaker 228 and display monitor 238. Additionally, an operating system such as AIX™ ("AIX" is a trademark of IBM Corporation) is utilized to coordinate the functions of the various components depicted in FIG. 8.

Preferred implementations of the invention include implementations as a computer system programmed to execute the method or methods described herein, and as a computer-program product. According to the computer system implementation, sets of instructions for executing the method and methods are resident in RAM 214 of one or more computer systems configured generally as described above. Until required by the computer system, the set of instructions may be stored as a computer-program product in another computer memory, for example, in disk drive 220 (which may include a removable memory such as an optical disk or floppy disk for eventual use in disk drive 220). Further, the computer-program product can also be stored at another computer and transmitted when desired to the user's workstation by a network or by an external network such as the Internet. One skilled in the art would appreciate that the physical storage of the sets of instructions physically changes the medium upon which it is stored so that the medium carries computer-readable information. The change may be electrical, magnetic, chemical, or some other physical change. While it is convenient to describe the invention in terms of instructions, symbols, characters, or the like, the reader should remember that all of these and similar terms should be associated with the appropriate physical elements.

Note that the invention describes terms such as disposing, providing, assigning, or other such terms that could be associated with a human operator. However, for at least a number of the operations described herein which form part of at least one of the embodiments, no action by a human operator is desirable. These operations described are, in large part, machine operations processing electrical signals to generate other electrical signals. Thus, a method for designing a macro, such as the macros depicted herein, can be accomplished with a computer-aided device. In such a method, data stored in a memory unit of a data-processing system such as data-processing system 200, can represent steps in a method for designing integrated circuitry such as the macros described earlier.

Figure 9:
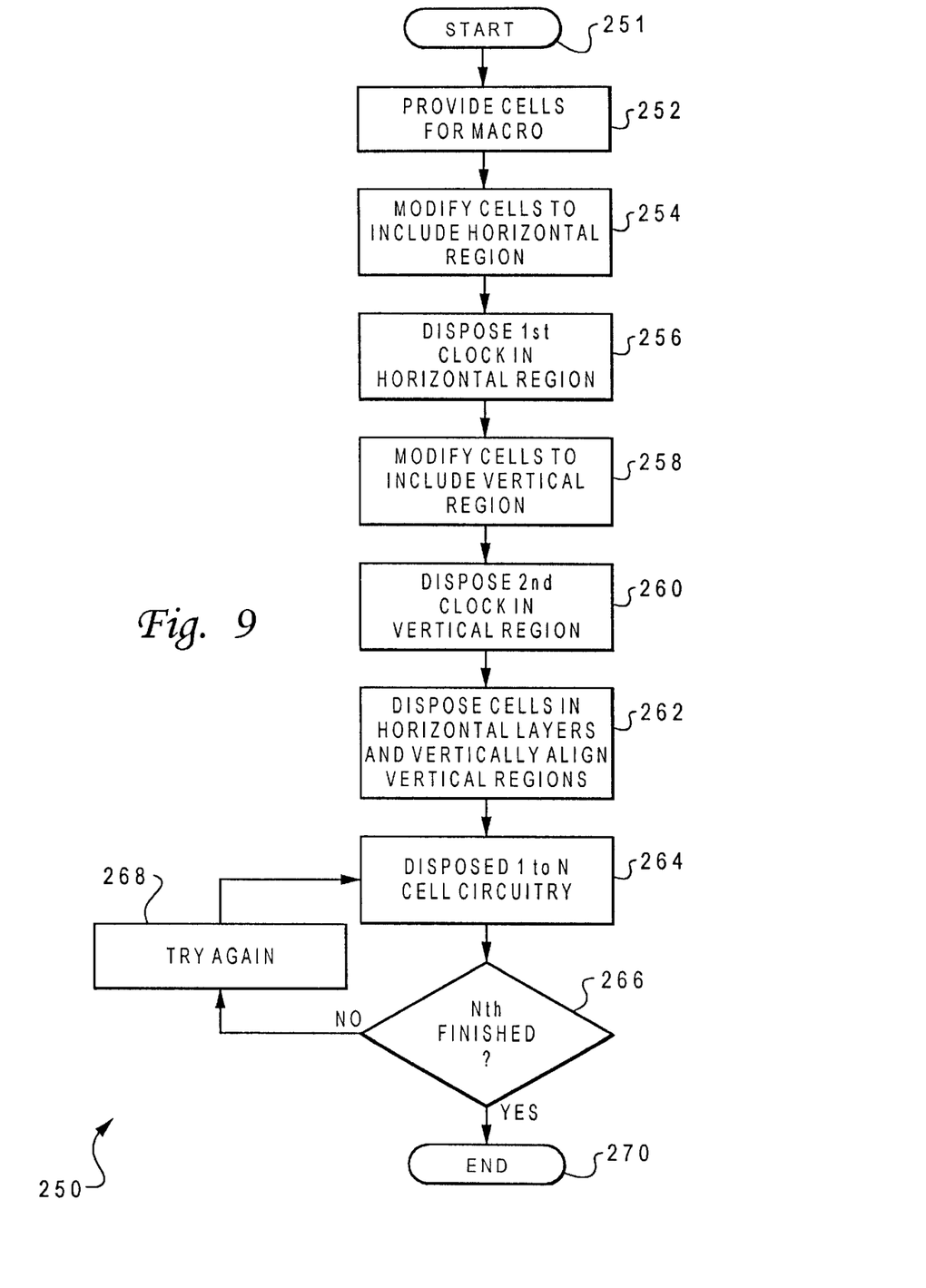
FIG. 9 illustrates a flowchart of operations illustrative of steps for designing a library of cell images having a multi-phase clock distribution scheme in accordance with the system and method of the present invention.

FIG. 9 illustrates a flowchart 250 of operations illustrative of steps for designing a library of cell images having a multi-phase clock distribution scheme in accordance with the system and method of the present invention. As described at block 251, the process initially begins. As illustrated at block 252, cells are provided for a cell macro. As depicted at block 254, the cells are modified to include at least one substantially horizontal region. As described at block 256, a substantially horizontal line for a first clock is disposed within one or more of the substantially horizontal regions. As illustrated at block 258, the cells are modified to include at least one substantially vertical region.

As depicted at block 260, a vertical line for a second clock is disposed within one or more of the substantially vertical regions. As described at block 262, the cells are disposed as representations of cells in substantially horizontal layers within the macro, and the vertical regions, including the lines therein for the second clock line, are substantially vertically aligned. Next, as illustrated at block 264, a first set of circuitry (e.g., NOR, NAND, latch circuits, etc.) are disposed as a representation within a first cell. Thereafter, as depicted at block 266, a test is performed to determine whether or not the Nth cell with the Nth set of circuitry disposed therein has been completed. If the Nth circuit is complete, the process ends, as illustrated at block 270. If not, the process repeats, as described at block 268, until the Nth cell in the macro is complete.

The clocking strategy of the present invention can reduce clock skew which, in turn, contributes directly to higher-performing VLSI designs. In a clocking system in which multiple clock lines are utilized, clock skew presents a delay problem. Clock skew is essentially the time between the latest-arriving clock at any latch point minus the earliest-arriving time of all of the clocks at all of the latch points. Thus, clock skew can be reduced by making this time difference as small as possible by, in effect, forcing the delay between the clocks to be constant. The present invention results in a clocking scheme in which low clock skew is achieved. Low clock skew in combination with a relatively small impact to wiring overhead is an advantage of the present invention. In addition, the aforementioned clocking strategy can be easily incorporated into design automation systems such as computer-aided design application packages.

Depending upon a desired implementation of a particular macro, additional vertical columns can be added or horizontal rows removed. In addition, the vertical and horizontal regions can be rearranged and juxtaposed in varying positions to satisfy a given macro function. Also, for example, the macros depicted herein can be reproduced multiple times to create even still-larger macros, if so desired.

The macros depicted herein, thus, can include a clock distribution system for a complex integrated-circuit device image, such that clock skew is reduced. The macro includes vertical regions within which are disposed an image of a first type of integrated-circuit clock, and horizontal regions within which are disposed a second type of integrated-circuit clock, such that the horizontal regions intersect the vertical regions in a manner which reduces clock skew within the complex integrated-circuit device image (i.e., macro), and contributes to the formation of the complex integrated-circuit device image in a space-efficient and wireable fashion. The first type of integrated-circuit clock can include a global clock. A column of clock regenerator cells can be included within one or more of the vertical regions. The global clock runs vertically through each vertical region to drive the column of clock regenerator cells. The second type of integrated-circuit clock can include a clock prewire, which runs horizontally through one or more of the horizontal regions to intersect one or more columns of clock regenerator cells.

While the invention has been particularly shown as described with reference to a preferred embodiment, it will be understood by those skilled in the art that various changes in form and detail may be made therein without departing from the spirit and scope of the invention.

What is claimed is:

1. A method for efficiently distributing a plurality of diverse clock phase signals throughout a complex integrated circuit device which includes multiple parallel rows of logic circuits, said system comprising:

n substantially parallel clock lines traversing said complex integrated circuit device, each of said n substantially parallel clock lines distributing a single diverse clock phase signal to logic circuits in an associated parallel row of logic circuits;

at least one substantially vertical region within said complex integrated circuit device, said at least one substantially vertical region traversing each of said n substantially parallel clock lines; and a plurality of clock regenerator cells within said at least one substantially vertical region, each of said plurality of clock regenerator cells coupled to one of said n substantially parallel clock lines such that an individual diverse clock phase signal may be coupled to any of said multiple parallel rows of logic circuits through a span of not greater than n−1 parallel rows of logic circuits such that clock skew is minimized.

2. The system for efficiently distributing a plurality of diverse clock phase signals throughout a complex integrated circuit device according to claim 1, wherein at least one of said n substantially parallel clock lines comprises a global clock signal.

3. The system for efficiently distributing a plurality of diverse clock phase signals throughout a complex integrated circuit device according to claim 1, wherein at least one of said n substantially parallel clock lines comprises a clock prewire.

4. The system for efficiently distributing a plurality of diverse clock phase signals throughout a complex integrated circuit device according to claim 1, wherein each of said n substantially parallel clock lines traversing said complex integrated circuit device comprises an M1 metal strip within said complex integrated circuit device.

5. The system for efficiently distributing a plurality of diverse clock phase signals throughout a complex integrated circuit device according to claim 1, further including multiple groups of n substantially parallel clock lines traversing said complex integrated circuit device.

6. A method for efficiently distributing a plurality of diverse clock phase signals throughout a complex integrated circuit device which includes multiple parallel rows of logic circuits, said method comprising the steps of:

laying out n substantially parallel clock lines traversing said complex integrated circuit device, each of said n substantially parallel clock lines distributing a single diverse clock phase signal to logic circuits in an associated parallel row of logic circuits;

disposing at least one substantially vertical region within said complex integrated circuit device, said at least one substantially vertical region traversing each of said n substantially parallel clock lines; and disposing a plurality of clock regenerator cells within said at least one substantially vertical region, each of said plurality of clock regenerator cells coupled to one of said n substantially parallel clock lines such that an individual diverse clock phase signal may be coupled to any of said multiple parallel rows of logic circuits through a span of not greater than n−1 parallel rows of logic circuits such that clock skew is minimized.

* * * * *